United States Patent [19]

Tozawa

[11] Patent Number: 5,053,744
[45] Date of Patent: Oct. 1, 1991

[54] COMBINATION METER SYSTEM OF VEHICLE

[75] Inventor: Yoshio Tozawa, Tokyo, Japan

[73] Assignee: Fuji Jukogyo Kabushiki Kaisha, Tokyo, Japan

[21] Appl. No.: 511,304

[22] Filed: Apr. 19, 1990

[30] Foreign Application Priority Data

Apr. 22, 1989 [JP] Japan .................. 1-48165[U]

[51] Int. Cl.$^5$ .............................. B60Q 1/00
[52] U.S. Cl. ................... 340/438; 340/461
[58] Field of Search ............... 340/461, 459, 441, 438; 324/158 MG, 73.1, 140, 102

[56] References Cited

U.S. PATENT DOCUMENTS

| | | | |
|---|---|---|---|
| 4,553,093 | 11/1985 | Chikasue | 324/169 |
| 4,635,034 | 1/1987 | Tokuyama et al. | 340/441 |
| 4,827,209 | 5/1989 | Tanaka et al. | 324/143 |
| 4,884,058 | 11/1989 | Ikeda | 340/461 |
| 4,924,178 | 5/1990 | Miyajima | 324/154 R |
| 4,991,098 | 2/1991 | Dantzler | 324/140 R X |

Primary Examiner—Donnie L. Crosland
Assistant Examiner—Brian R. Tumm
Attorney, Agent, or Firm—Beveridge, DeGrandi & Weilacher

[57] ABSTRACT

A vehicle is equipped with a combination meter system including a plurality of gauges or meters, comprising a plurality of sensors for detecting various characteristics for the operation of a vehicle and a plurality of analog switches operatively connected to the sensors, respectively. A pulse control circuit transmitting pulse signals is connected to the analog switches for selectively operating the analog switches and a decoder circuit is operated responsive to the pulse signals from the pulse control circuit for producing a signal indicating one of the analog switches to which the pulse signal is applied. A distribution circuit is connected to the analog switches and responsive to the signal from the decoder circuit for dividing a signal from the one of the analog switches into two kinds of signals based on the characteristic of one of the sensors corresponding to the one of the analog switches. A plurality of sample and hold circuits are connected to the voltage distribution circuit and respectively corresponding to the analog switches for sampling and holding the two kinds of signals from the distribution circuit, the sample and hold circuits being connected to the gauges or meters, respectively, for driving the same.

8 Claims, 5 Drawing Sheets

| OPERATION OF SWITCH | SW(1) ON | SW(2) ON | SW(3) ON | SW(4) ON |
|---|---|---|---|---|
| DECODER | IDENTIFI-CATION SIGNAL (1) | IDENTIFI-CATION SIGNAL (2) | IDENTIFI-CATION SIGNAL (3) | IDENTIFI-CATION SIGNAL (4) |
| SAMPLE AND HOLD CIRCUIT | (1) SAMPLING | (2) SAMPLING | (3) SAMPLING | (4) SAMPLING |

⟶ T

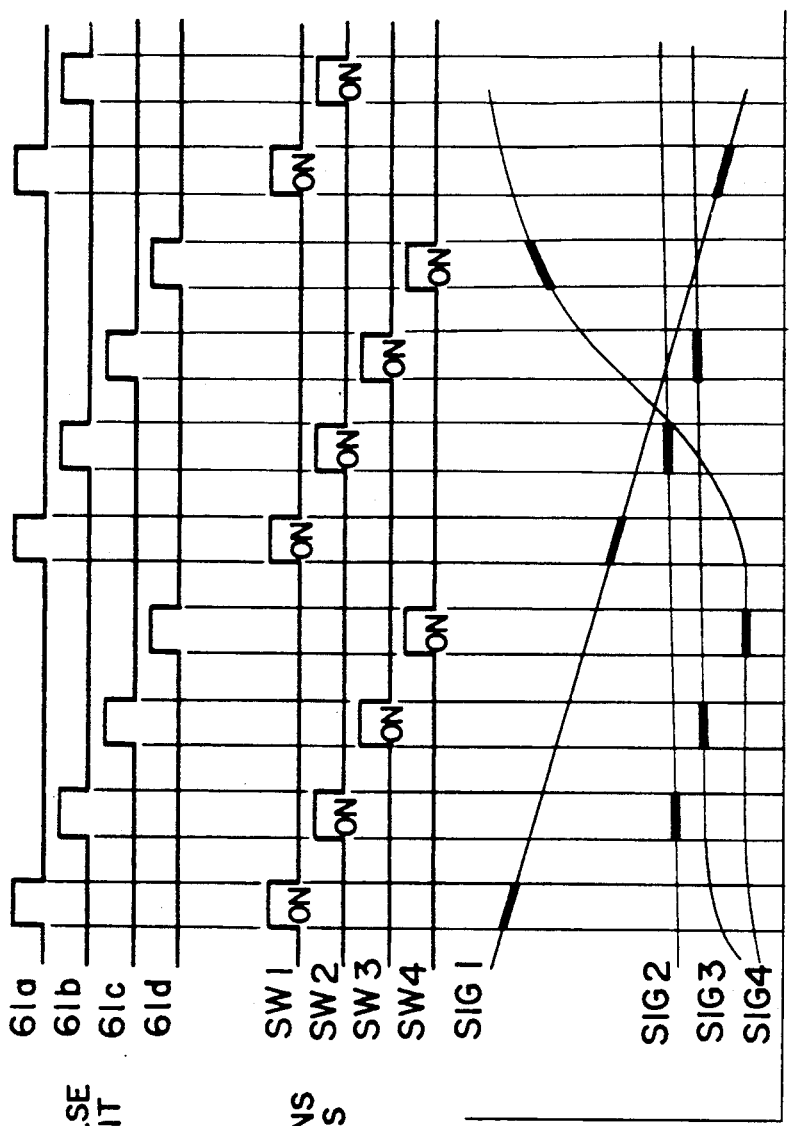

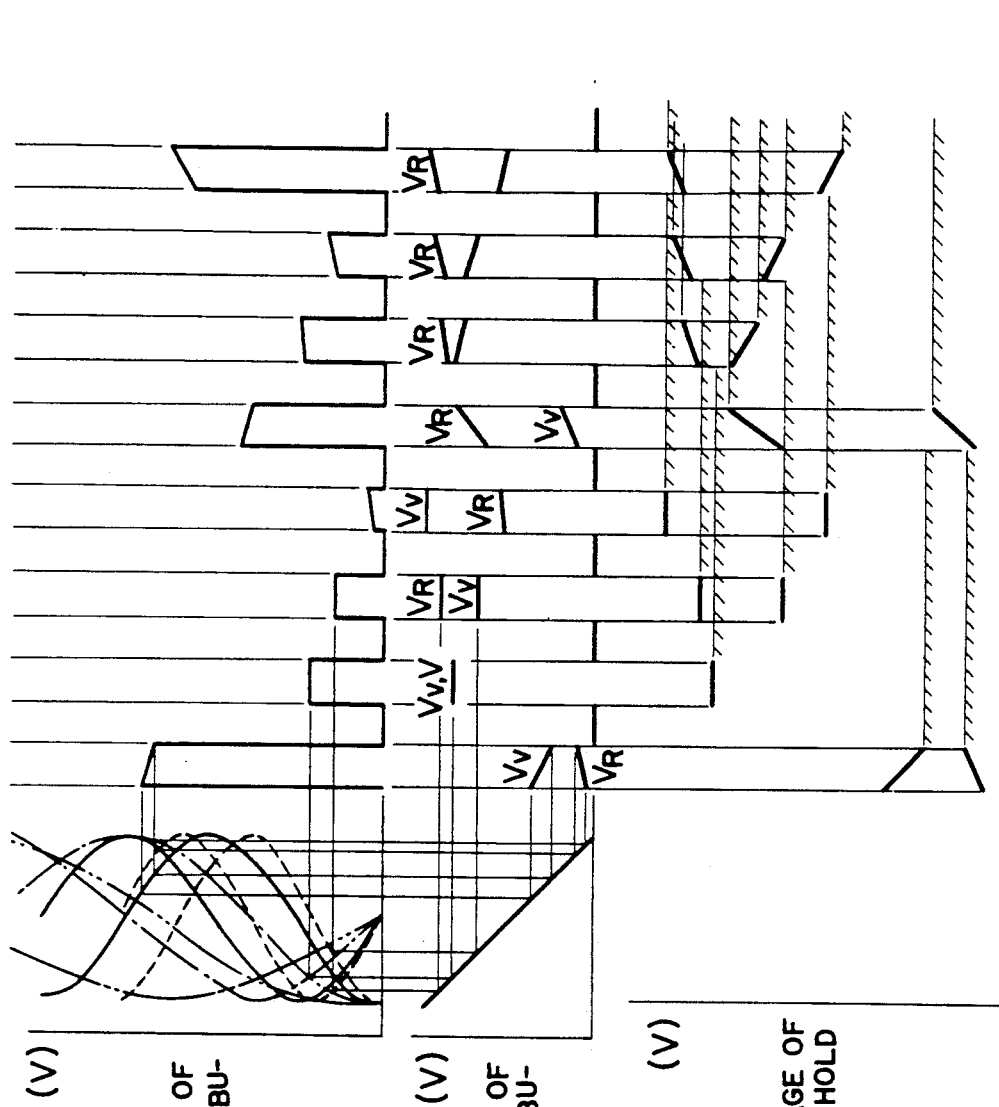

COMBINATION METER SYSTEM OF VEHICLE

BACKGROUND OF THE INVENTION

The present invention relates to a combination meter system of a vehicle particularly for improving the precision of various meters or gauges and reducing construction cost by sharing a drive circuit.

An instrument panel of a vehicle is equipped with various gauges such as speed meter, tachometer and the like, which are arranged as a combination meter system in front of a driver sitting on a driver's seat. In a conventional system, independent meters or gauges are merely concentrated in one portion and share only a power source and an earth. An electric power is supplied to a fuel sensor, a temperature sensor of a coolant, a voltage sensor of an alternator to thereby drive a fuel gauge, a temperature gauge, a voltage gauge, respectively.

Driving speed of the vehicle is detected by converting a frequency of a signal output from a speed sensor mounted on an output shaft of a transmission to a corresponding voltage, and by supplying the converted voltage to a gauge as a speed meter through a voltage distribution circuit and an amplifier to drive the gauge.

The Japanese Patent Laid-open Publication No. 53-120016 discloses a combination meter system described above. In such a prior art, there is merely shown a combination meter system in which respectively independent gauges are merely aggregated and share only the power source and the earth. In addition, the respective gauges are not provided with self-adjusting functions, resulting in inferior accuracy and lacking uniformity of qualities of products.

SUMMARY OF THE INVENTION

An object of the present invention is to substantially improve defects encountered in the prior art and to provide a combination meter system of a vehicle capable of simplifying the construction thereof by sharing constructional elements to a large extent.

Another object of the present invention is to improve the precision of meters or gauges in the system.

Another object of the present invention is to make the adjustment of the characteristics of the meters or gauges possible.

This and other objects can be achieved according to the present invention by providing a combination meter system of a vehicle equipped with a plurality of gauges or meters, comprising: a plurality of sensors for detecting various characteristics for the operation of a vehicle; a plurality of analog switches operatively connected to said sensors, respectively; a pulse control circuit transmitting pulse signals to said analog switches for selectively operating said analog switches; a decoder circuit responsive to the pulse signals from said pulse control circuit for producing a signal indicating one of said analog switches to which said pulse signal is applied; a distribution circuit operatively connected to said analog switches and responsive to said signal from said decoder circuit for dividing a signal from said one of said analog switches into two kinds of signals based on the characteristic of one of said sensors corresponding to said one of said analog switches; and a plurality of sample and hold circuits operatively connected to said voltage distribution circuit means and respectively corresponding to said analog switches for sampling and holding said two kinds of signals from said distribution circuit, said sample and hold circuits being operatively connected to the gauges or meters, respectively, for driving the same.

According to the embodiment of the present invention described above, in the respective meters or gauges of the combination meter system, the inputs detected by the respective sensors through the analog switches driven by the pulse control circuit, are transmitted into the distribution circuit. The signal from the decoder circuit is transmitted into the distribution circuit. The output signals from the distribution circuit are sampled and held in the sample and hold circuits. The respective meters or gauges are hence driven by the signals held at the respective sample and hold circuits.

BRIEF DESCRIPTION OF THE DRAWINGS

For a further understanding the objects of the present invention, reference should be made to the following detailed description, taking in conjunction with the accompanying drawings, wherein:

FIGS. 4A to 4F are time charts of the respective circuits shown in FIG. 1; and

DESCRIPTION OF THE PREFERRED EMBODIMENT

Figures 2, 5:
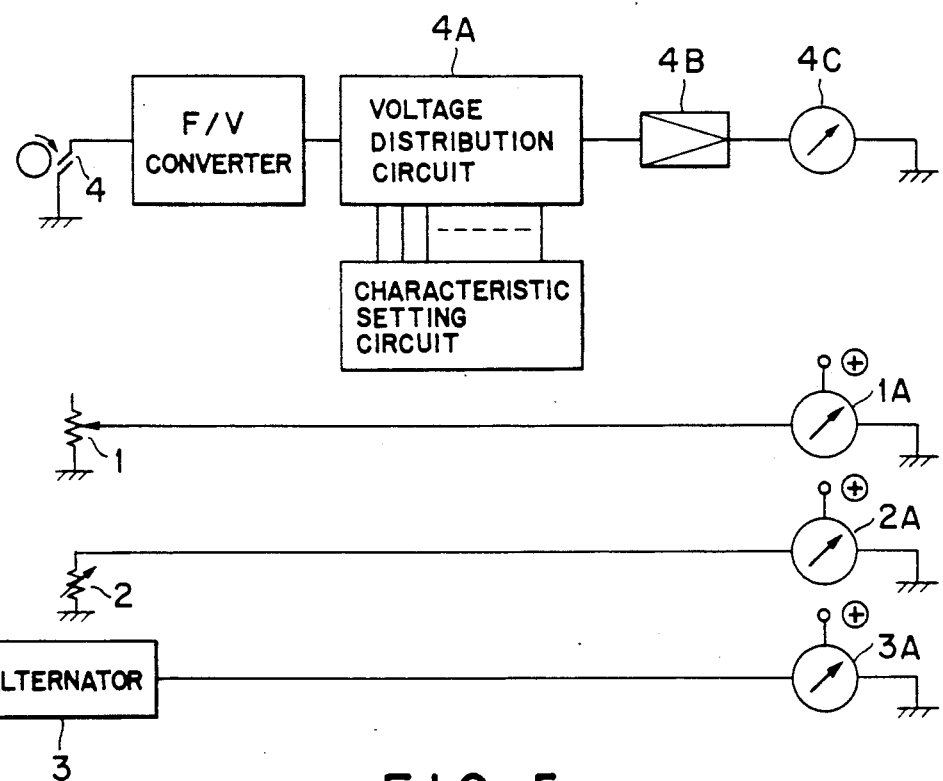
FIG. 2 is a table representing the operation of the circuit diagram shown in FIG. 1.
FIG. 5 is a schematic diagram representing a conventional combination meter system for a vehicle.

For better understanding the present invention, the prior art technology will be first briefly described in conjunction with FIG. 5.

Referring to FIG. 5 showing a conventional combination meter system, an electric power is supplied to a fuel sensor 1, a temperature sensor 2 of a coolant and a voltage sensor 3 of an alternator to thereby drive a fuel gauge 1A, a temperature gauge 2A and a volt gauge 3a, respectively. Namely, these independent gauges are merely arranged in one portion and share only a power source and an earth.

An output from a speed sensor 4 mounted on an output shaft of a transmission, is F/V converted and then supplied to a voltage distribution circuit 4A, an amplifier 4B and then into a gauge as a speed meter 4C. Vehicle speed is displayed by the speed meter 4C. However, the conventional combination meter system provides various problems or disadvantages as described hereinbefore.

The present invention to solve these problems will be described hereunder with reference to a preferred embodiment represented by FIGS. 1 to 4.

Figure 1:
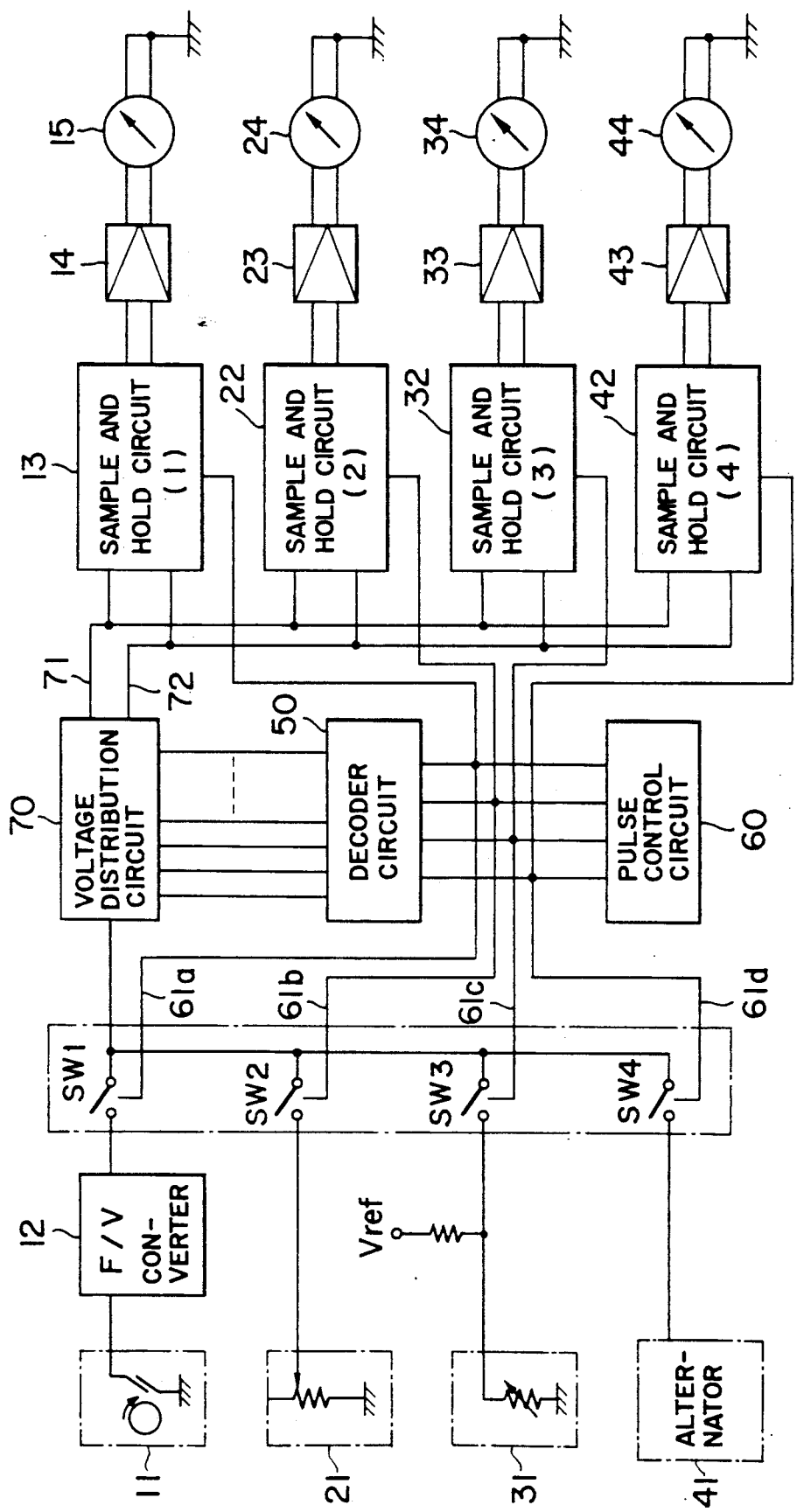
FIG. 1 is a circuit diagram of a combination meter system of a vehicle according to the present invention.

Referring to FIGS. 1 to 3, a combination meter system according to the present invention is equipped with a vehicle speed sensor 11 for detecting the vehicle speed by counting rotation numbers of an output shaft of a transmission, a fuel sensor 21 for detecting a fuel level in a fuel tank, a temperature sensor 31 for detecting a temperature of a coolant of an engine, and a voltage sensor 41 for detecting a generating voltage of an alternator driven by the engine. Output from the speed sensor 11 is transmitted to an analog switch SW1 through an F/V converter 12. Output from the fuel sensor 21 is transmitted to an analog switch SW2. Output from the temperature sensor 31 is transmitted to an analog switch SW3 and output from the voltage sensor 41 is transmitted to an analog switch SW4.

These analog switches SW1 to SW4 are respectively connected to a pulse control circuit 60, through independent control lines 61a to 61d. The pulse control circuit 60 operates to sequentially output pulse signals to the respective control lines 61a to 61d for predetermined periods to selectively drive the analog switches SW1 to SW4. The respective control lines 61a to 61d are also connected to a decoder circuit 50 to input the pulse signals. The decoder circuit 50 outputs identification signals corresponding to the analog switches selected in response to the pulse signals to a voltage distribution circuit 70. Lines from the switches SW1 to SW4 are connected to a line which is extended from the distribution circuit 70. The voltage distribution circuit 70 comprises a microcomputer and processes, as described later, the output from the sensor through the selected analog switch in response to the signal from the decoder circuit 50 to output two kinds of voltage signals. The two voltage signals are fed into sample and hold circuits 13, 22, 32 and 42 through lines 71 and 72 and then further transmitted to a speed meter 15, a fuel gauge 24, a temperature gauge 34 and a voltmeter 44 through amplifiers 14, 23, 33 and 43, respectively. The respective sample and hold circuits are connected to the corresponding control lines 61a to 61d. Accordingly, the analog switch and the sample and hold circuit in correspondence to the control line to which a pulse signal is applied from the pulse control circuit 60 are operated. Therefore, a signal from the corresponding sensor is transmitted to the voltage distribution circuit 70, and the two voltage signals processed in the voltage distribution circuit 70 are thereafter transmitted to the corresponding meters or gauges.

The combination meter system described above will operate in the following manner.

The speed sensor 11 outputs signals which have frequency corresponding to rotational speed of the output shaft of the transmission. The F/V converter 12 converts the frequency into corresponding voltage, and then the voltage is transmitted to the analog switch SW1 as the vehicle speed. The analog switch SW1 is driven by the pulse control circuit 60 and the output voltage from the F/V converter 12 is processed in the voltage distribution circuit 70 in response to the signal representing the speed detection timing from the decoder circuit 50. According to the process in the voltage distribution circuit 70, two output signals generated therefrom are held in the sample and hold circuit 13 and amplified in the amplifier 14 to drive the speed meter 15.

The output voltage from the fuel sensor 21 is also input into the voltage distribution circuit 70 through the analog switch SW2 driven by the pulse control circuit 60 in a substantially same manner as that of the speed sensor 11. Two output signals from the distribution circuit 70 set in response to the identification signal from the decoder circuit 50 are held in the sample and hold circuit 22 and then amplified by the amplifier 23 to drive the fuel gauge 24.

The coolant temperature is detected by the temperature sensor 31 and the output voltage therefrom is input into the voltage distribution circuit 70 through the analog switch SW3 driven by the pulse control circuit 60. Two output signals from the circuit 70 set in response to the signal from the decoder circuit 50 are held in the sample and hold circuit 32 and then amplified by the amplifier 33 to drive the temperature gauge 34.

The generating voltage of the alternator is detected by the voltage sensor 41 and the output voltage therefrom is input into the voltage distribution circuit 70 through the analog switch SW4 driven by the pulse control circuit 60. Two output signals from the circuit 70 set in response to the signal from the decoder circuit 50 are held in the sample and hold circuit 42 and then amplified by the amplifier 43 thereby to drive the voltmeter 44.

Figure 3A:
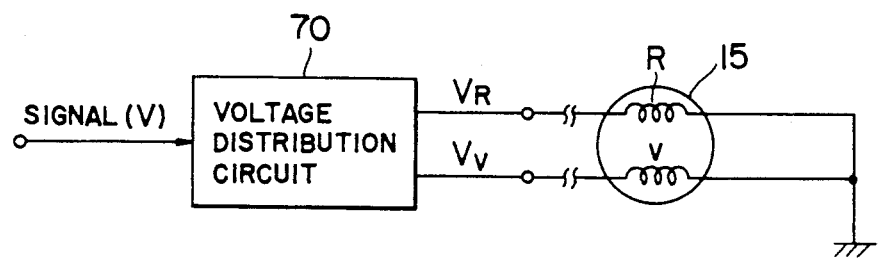
FIGS. 3A and 3B are views describing the operation of a gauge including a cross coil.
Figure 3B:
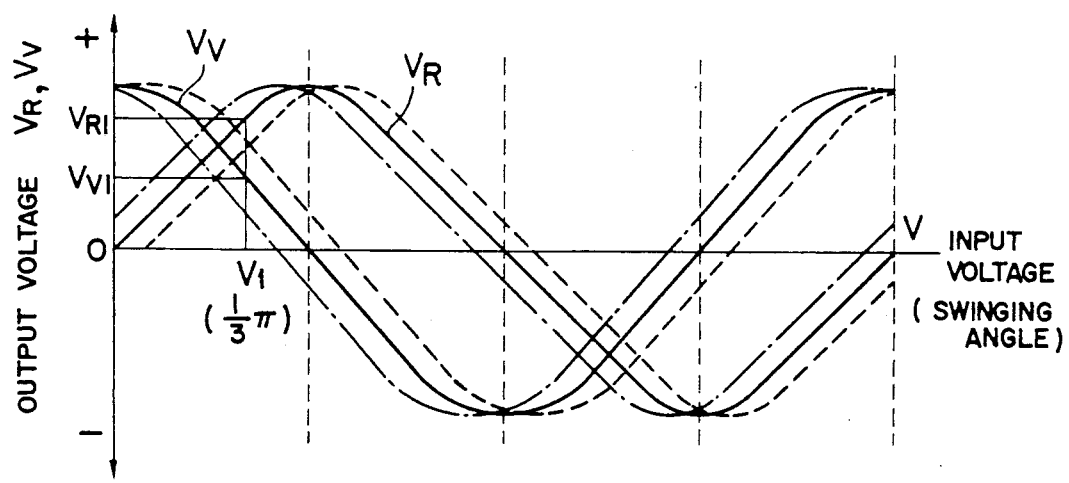

Each meter or gauge includes coils R and v, as shown in FIG. 3A, which is crossed and combined with a condition rotated by 90° to provide a cross coil. A rotor coupled with a pointer of the meter or gauge is provided inside the cross coil and is rotated in response to the operation of the cross coil. In the voltage distribution circuit 70, the one of the two output voltages is set based on a substantially sine function and the other of two output voltages is set based on cosine function as represented in FIG. 3B. The functions are stored in a table of the voltage distribution circuit 70. One period of the sine function or cosine function coincides with one rotation of each meter or gauge. Accordingly, for example, when two output voltages $V_{R1}$ and $V_{v1}$ with respect to an input voltage Vi are given respectively to the coils R and v of the meter or gauge, the direction of combined magnetic flux of both the coils, i.e. the direction of the pointer of the meter or gauge (swinging angle $\frac{1}{3}\pi$) is immediately determined (shown in FIG. 3B). In the meantime, since the output voltages of the sensors with respect to the same swinging angles of the pointers in the respective meters or gauges are different, peculiar sine function and cosine functions are provided for each sensor, so as to set an independent table. Accordingly, the voltage distribution circuit 70 discriminates the sensor to be detected in response to the identification signal from the decoder circuit 50, so that the table adapted for the sensor to be detected can be looked up.

The operations of the respective circuits will be described hereafter in conjunction with time charts represented by FIG. 4.

First, the pulse control circuit 60 outputs pulse signals to the control lines 61a to 61d in a predetermined sequence with predetermined time intervals (FIG. 4A). One of the analog switches SW1 to SW4 corresponding to the output pulse signal is made "ON" for the period of the pulse (FIG. 4B). In a case where the output voltage of the corresponding sensor is changed with the lapse of the time as shown in FIG. 4C, the input voltage into the voltage distribution circuit 70 in response to the ON or OFF conditions of the analog switches SW1 to SW4 will be represented by FIG. 4D. While, the decoder circuit 50 outputs a binary code signal corresponding to the pulse signals to the voltage distribution circuit 70. The voltage distribution circuit 70 looks up the two output voltages $V_R$ and $V_v$ from the table (FIG. 4E). The voltages $V_R$ and $V_v$ are given to all the sample and hold circuits through the lines 71 and 72. Only the corresponding sample and hold circuit to which the pulse signal is applied samples the voltages $V_R$ and $V_v$ given through the lines 71 and 72 whereas other sample and hold circuits hold the voltages $V_R$ and $V_v$ which are previously sampled (FIG. 4F). The outputs from the sample and hold circuits are amplified respectively by the amplifiers and transmitted to the cross coil of the respective meters or gauges. In such a manner, the rotor is rotated and the pointer indicates a value in response to the output from each sensor.

In the described preferred embodiment according to the present invention, each meter or gauge is driven by applying, to two coils of the cross coil, two kinds of voltages set in accordance with the sine function and cosine function in response to the input voltage from the sensor, but the present invention is not limited to the described embodiment hereinbefore and may be applicable to a case in which the direction of the magnetic flux is changed by variation of current to be applied to the coils in accordance with the sine function and the cosine function.

As described above, according to the present invention, since the two outputs of the voltage distribution circuit are looked up from the table, the display characteristics of the meter or gauge with respect to the input signals from the sensors may be optionally changed by replacing the contents in the table as shown in FIG. 3B with broken lines and dot-chain lines.

Furthermore, according to the present invention, since each input from each sensor is divided into two components in accordance with the sine function and cosine function and the divided outputs are given to two coils of the cross coil, it is possible to swing the pointer of the meter or gauge by 360°, so that the display range of the gauge can be widened, resulting in the improvement of the reading performance of the meter or the gauge.

Still furthermore, although the cross coil has the error in cross angle, the error can be obviated by rewriting the tables for two outputs of the voltage distribution circuit according to the present invention.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A combination meter system of a vehicle equipped with at least a plurality of gauges or meters, comprising:
   a plurality of sensors for detecting various characteristics for the operation of a vehicle;
   a plurality of analog switches operatively connected to said sensors, respectively;
   a pulse control circuit transmitting pulse signals to said analog switches for selectively operating said analog switches;
   a decoder circuit responsive to the pulse signals from said pulse control circuit for producing a signal indicating one of said analog switches to which said pulse signal is applied;
   a voltage distribution circuit operatively connected to said analog switches and responsive to said signal from said decoder circuit for dividing a signal from said one of said analog switches into two kinds of signals based on the characteristic of one of said sensors corresponding to said one of said analog switches; and
   a plurality of sample and hold circuits operatively connected to said voltage distribution circuit and respectively corresponding to said analog switches for sampling and holding said two kinds of signals from said distribution circuit, said sample and hold circuits being operatively connected to the gauges or meters, respectively, for driving the same.

2. The system according to claim 1, further comprising:
   a plurality of control lines independently connecting said pulse control circuit to said decoder circuit, each of said control lines connecting one of said analog switches with a corresponding one of said sample and hold circuits through the voltage distribution circuit.

3. The system according to claim 1, further comprising:
   an input line of said distribution circuit which is connected to said analog switches in parallel; and
   two output lines of said distribution circuit respectively connected to said sample and hold circuits in parallel, said output lines transmit said two kinds of signals, respectively.

4. A system according to claim 1, wherein said two kinds of signals are voltage signals.

5. The system according to claim 1, wherein said two kinds of signals are current signals.

6. A system according to claim 1, wherein the two kinds of signals from said distribution circuit are set based on a sine function and a cosine function which are peculiar to each said sensor.

7. A system according to claim 6, wherein said distribution circuit means includes table means for storing values of said two kinds of signals which are set based on said sine function and said cosine function.

8. A system according to claim 1, wherein each said gauge or meter includes two coils constituted as a cross coil.

* * * * *